(12) United States Patent
Balachandran et al.

(10) Patent No.: US 9,246,499 B2
(45) Date of Patent: Jan. 26, 2016

(54) DIGITAL PHASE LOCK LOOP CIRCUIT INCLUDING FINITE IMPULSE RESPONSE FILTERING TO REDUCE ALIASING OF QUANTIZATION NOISE

(71) Applicant: Robert Bosch GmbH, Stuttgart (DE)

(72) Inventors: Ganesh K. Balachandran, Sunnyvale, CA (US); Vladimir P. Petkov, San Jose, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/283,816

(22) Filed: May 21, 2014

(65) Prior Publication Data

US 2015/0341042 A1 Nov. 26, 2015

(51) Int. Cl.
*H03L 7/06* (2006.01)
*H03L 7/093* (2006.01)
*H03L 7/099* (2006.01)

(52) U.S. Cl.
CPC ............. *H03L 7/093* (2013.01); *H03L 7/099* (2013.01)

(58) Field of Classification Search
USPC .................................................. 327/147, 156
See application file for complete search history.

(56) References Cited

U.S. PATENT DOCUMENTS

| | | | | |
|---|---|---|---|---|
| 5,686,841 A * | 11/1997 | Stolarczyk | ............. | G01N 22/04 244/134 F |
| 7,432,751 B2 * | 10/2008 | Fang | ...................... | G01R 25/04 327/107 |
| 7,492,195 B1 * | 2/2009 | Patil | ...................... | H03L 7/1976 327/147 |
| 8,358,729 B2 * | 1/2013 | Bae | ...................... | H03L 7/0891 327/155 |
| 8,411,788 B2 * | 4/2013 | Sahota | ...................... | H03C 5/00 327/147 |
| 8,634,512 B2 * | 1/2014 | Leung | ................... | H03C 3/0941 327/156 |
| 8,664,989 B1 * | 3/2014 | Singh | ................... | H03L 7/1976 327/147 |
| 8,836,434 B2 * | 9/2014 | Bellaouar | ............ | H03C 3/0991 327/156 |
| 2002/0061087 A1 * | 5/2002 | Williams | ......... | G11B 20/10055 375/376 |
| 2002/0122478 A1 * | 9/2002 | Hirasaka | .......... | G11B 20/10009 375/229 |
| 2009/0258612 A1 * | 10/2009 | Zhuang | .................... | H03C 5/00 455/110 |
| 2009/0322439 A1 * | 12/2009 | Mayer | ...................... | H03C 3/04 332/118 |
| 2012/0098578 A1 * | 4/2012 | Newton | .................. | H03L 7/093 327/156 |
| 2013/0002317 A1 * | 1/2013 | Frantzeskakis | ........... | H03L 7/08 327/156 |
| 2013/0257494 A1 * | 10/2013 | Nikaeen | ................ | H03M 3/458 327/156 |
| 2014/0340131 A1 * | 11/2014 | Rey | ....................... | H03L 7/0993 327/156 |
| 2014/0354336 A1 * | 12/2014 | Syllaios | .................. | H03L 7/189 327/157 |

OTHER PUBLICATIONS

Cherry, James A. et al., Clock Jitter and Quantizer Metastability in Continuous-Time Delta-Sigma Modulators, IEEE Transactions on Circuits and Systems-II: Analog and Digital Signal Processing, vol. 46, No. 6, Jun. 1999.

(Continued)

*Primary Examiner* — Adam Houston
(74) *Attorney, Agent, or Firm* — Maginot Moore & Beck LLP

(57) ABSTRACT

A digital phase lock loop circuit includes a phase detector, loop filter, finite impulse response filter (FIR), a plurality of digital to analog converters (DACs), a voltage controlled oscillator (VCO), and a divider. The FIR filter includes a predetermined number of taps, where each tap is connected to an input of one DAC in the plurality of DACs. The FIR filter attenuates high-frequency quantization error in a digital control signal that the plurality of DACs converts to an analog control signal for the VCO. The FIR filtered control signal reduces or eliminates quantization noise higher-frequency components that would otherwise be generated as DC quantization noise in a feedback signal generated by the divider.

8 Claims, 7 Drawing Sheets

(56) References Cited

OTHER PUBLICATIONS

Oliaei, Omid, Sigma-Delta Modulator with Spectrally Shaped Feedback, IEEE Transactions on Circuits and Systems-II: Analog and Digital Signal Processing, vol. 50, No. 9, Sep. 2003.

Staszewski, Robert Bogdan et al., Digitally Controlled Oscillator (DCO)-Based Architecture for RF Frequency Synthesis in a Deep-Submicrometer CMOS Process, IEEE Transactions on Circuits and Systems-II: Analog and Digital Signal Processing, vol. 50, No. 11, Nov. 2003.

Reddy, Karithikeyan et al., Fundamental Limitations on Continuous-Time Delta-Sigma Modulators Due to Clock Jitter, IEEE Transactions on Circuits and Systems-I: Regular Papers, vol. 54, No. 10, Oct. 2007.

Jee, Dong-Woo et al., A 2 GHz Fractional-N Digital PLL with 1b Noise Shaping ΔΣ TDC, IEEE Journal of Solid-State Circuits, vol. 47, No. 4, Apr. 2012.

* cited by examiner

DIGITAL PHASE LOCK LOOP CIRCUIT INCLUDING FINITE IMPULSE RESPONSE FILTERING TO REDUCE ALIASING OF QUANTIZATION NOISE

FIELD

This disclosure relates generally to the field of electronic circuits, and, more particularly, to phase lock loop circuits.

BACKGROUND

Phase lock loop circuits (PLLs) are electronic control circuits that are widely employed in radio, telecommunications, computers and other electronic applications. A few common applications of PLLs include signal demodulation, signal recovery from a noisy channel, generation of a stable frequency at multiples of an input frequency (frequency synthesis), and distribution of precisely timed clock pulses in digital logic circuits such as microprocessors. Since a single integrated circuit can provide a complete phase-locked-loop building block, the technique is widely used in modern electronic devices. These circuits can produce output frequencies from a fraction of a hertz up to many gigahertz.

FIG. 6 depicts an arrangement of functional units in a prior art digital PLL 600 that is configured to generate a higher frequency output signal with reference to a lower frequency input signal. The PLL 600 includes phase detector/phase frequency detector 608, a low-pass loop filter 612, voltage controlled oscillator (VCO) 616 and a frequency divider 620. An external frequency generator produces a reference input signal 604 that is applied to an input of the phase detector 608. The output of the phase detector passes through a loop filter 612 and the filtered output operates the VCO 616. The VCO 616 accepts an analog control signal in the PLL circuit 600. A digital to analog converter (DAC) 614 generates an analog signal corresponding to a digital output signal from the loop filter 612. In the PLL circuit 600, a sigma-delta modulator 613 receives the filtered digital control signal from the loop filter 612 and generates a high frequency dithered control signal output for the input of the DAC 614. The VCO 616 generates an output signal 640, which is passed to a frequency divider 620 and the output of the frequency divider 620 provides feedback to the phase detector 608. In many embodiments, the phase detector 608 is a multiplier that produces a product of two signals to downconvert an input signal to another signal with low frequency that is close to DC. The VCO 616 is tuned to a range of frequencies corresponding to the higher frequency harmonic so the output of the PLL 640 is a higher frequency multiple of the input reference signal 604.

The phase detector 608 identifies differences in phase between the input reference signal 604 and the output of the PLL 600. In situations where the PLL 600 is generating a multiplied frequency output, the higher frequency output signal 640 would not correspond to the lower-frequency input signal 604. The frequency divider 620 receives the higher frequency output 640 and generates a lower frequency output at the same frequency as the input reference signal 604 for the phase detector 608. The phase detector 608 identifies deviations between the phase of the output signal from the frequency divider 620 and the input reference signal 604. If the input reference signal and feedback signal are locked in phase, then the two signals are orthogonal to one another (separated by 90°). The phase detector 608 generates a corrected output signal in response to any errors between the phases of the input and output signals. Thus, the PLL circuit uses a negative feedback loop to correct phase differences between the input reference signal and an output signal.

In the PLL circuit 600, the DAC 614 generates an analog output that controls the VCO 616 to generate a signal for the feedback divider 620. In one embodiment, the DAC 614 is a sigma-delta modulator that generates an analog version of the digital control signal from the loop filter 612.

The DAC 614 can generate a comparatively limited number of distinct output levels, which is typically expressed as $2^M$ levels for a DAC with M bits of resolution. For example, a 4-bit DAC generates 16 distinct output levels. In many instances, control of the VCO 616 requires greater precision than 16 control levels, so the DAC 614 receives a digital control signal that switches between different digital values at a high frequency to enable the DAC 614 to generate the analog control signal at average levels that are between the limited number of discrete output levels for the DAC 614. This high frequency operation of the DAC 614 in response to the dither signal from the sigma-delta modulator 613 is known as dithered operation. During dithered operation, the output from DAC 614 changes between distinct output levels in response to the dithered digital control signal from the from the sigma-delta modulator 613. The sigma-delta modulator 612 dithers the digital control signal from the loop filter 612 at a high frequency, such as $\frac{1}{4}^{th}$ the frequency of the output signal from the VCO 616, and the DAC 614 switches output levels rapidly with reference to the dithered control signal. The rapid switching between output levels for the output of the DAC 614 produces a range of control signals that include intermediate values between the comparatively limited number of discrete output levels for the DAC 614, and enables detailed control of the VCO 616. The dithering process generates quantization noise in the control signal that is applied to the VCO 616. Since the dithering of the output from the DAC 614 occurs at a high frequency, the dithering noise has minimal negative impact on the control signal for the VCO 616, which typically has a low frequency band that includes 0 Hz (DC).

While the dithered output signal of the DAC 614 is generated with a high frequency that is suitable for use with the VCO 616, the feedback divider 620 shifts the quantization noise from the DAC 614 down to lower frequencies that potentially interfere with the operation of the PLL because the feedback divider 620 suffers from aliasing while sampling the output signal from the VCO 616. FIG. 7 depicts the low frequency noise in more detail. In FIG. 7, the timing diagram 704 depicts an ideal high-frequency output signal from the VCO 616 that is provided as input to the divider 620. The timing diagram 708 depicts an actual output from the VCO 616 that includes quantization noise components from the DAC 614. The quantization noise manifests as jitter in the periods and phase of the high-frequency output signal 708. The divider 620 usually samples the noisy output signal 708 at a frequency lower than the DAC frequency to generate a lower-frequency divider output signal 712. For example, in FIG. 7 the divider 620 samples the noisy signal 712 at $\frac{1}{4}^{th}$ the frequency of the output signal from the VCO 616 in the PLL circuit. Due to aliasing that occurs when sampling at $\frac{1}{4}^{th}$ of the frequency of the output signal from the VCO 616, the divider 620 aliases the quantization noise in the high-frequency signal 708 in the lower-frequency feedback signal 712. As depicted in the graph 724, the quantization phase noise at the high-frequency output of the VCO 616 mostly occurs at high-frequencies with low quantization noise levels near 0 Hz (DC). However, the operation of the divider 620 shifts or "folds back" the quantization noise to lower-frequencies. The graph 728 depicts large portions of the quantization noise around ¼ and ½ of the frequency $f_{clk}$ from the VCO 616 are shifted down to the $f_{clk}/8$ frequency to increase the DC quantization noise level 732 at that range.

In prior art PLL circuits, one method to reduce the effects of the quantization noise in the divider is to reduce the gain of the VCO 616. However, reducing the gain of the VCO 616 also makes the PLL circuit 600 less effective at maintaining a lock on the reference signal in the presence of drift and other variations in the reference signal. Consequently, improvements to PLL circuits that reduce low-frequency quantization noise would be beneficial.

SUMMARY

In one embodiment, a digital phase lock loop (PLL) circuit that generates a feedback signal from a voltage control oscillator with reduced quantization noise for a divider that receives the feedback signal has been developed. The digital PLL circuit includes a phase detector having a first input that receives a reference signal with a predetermined waveform at a predetermined frequency and a second input that receives a feedback signal, the phase detector being configured to generate a digital control signal with reference to the reference signal and the feedback signal, a loop filter having an input that receives the control signal from an output of the phase detector, the loop filter being configured to generate a digital filtered control signal, a modulator having an input that receives the digital filtered control signal from an output of the loop filter, the modulator being configured to generate a dithered digital control signal with reference to the digital filtered control signal, a finite impulse response (FIR) filter having a predetermined number of taps, an input that connects an output of the modulator to the predetermined number of taps, the FIR being configured to reduce quantization noise in the dithered digital control signal, a plurality of DACs, each DAC having an input that is connected to an output of one of the taps in the FIR filter to generate an analog control signal in response to output from the FIR filter, a voltage controlled oscillator (VCO) having an input connected to outputs of the plurality of DACs to receive the analog control signal from the plurality of DACs, the VCO being configured to generate an output signal having a frequency that corresponds to a multiple of the frequency of the reference signal with reference to the analog control signal, and a first divider having an input that receives the output signal from the VCO and an output that generates the feedback signal with reference to the output signal at the frequency of the reference signal for the second input of the phase detector.

In another embodiment, a digital phase lock loop (PLL) circuit that generates a feedback signal from a voltage control oscillator with reduced quantization noise for a divider that receives the feedback signal has been developed. The digital PLL circuit includes a phase detector having a first input that receives a reference signal with a predetermined waveform at a predetermined frequency and a second input that receives a feedback signal, the phase detector being configured to generate a digital control signal in response to the reference signal and the feedback signal, a loop filter having an input that receives the control signal from an output of the phase detector, the loop filter being configured to generate a digital filtered control signal, a finite impulse response (FIR) filter having a predetermined number of taps and an input that is connected to an output of the loop filter, the FIR being configured to reduce quantization noise in the digital filtered control signal, a voltage controlled oscillator (VCO) having a plurality of tunable elements, each tunable element being connected to one tap in the plurality of taps in the FIR filter to enable the VCO to generate an output signal having a frequency that corresponds to a multiple of the frequency of the reference signal with reference to the digital filtered control signal, and a divider having an input that receives the output signal from the VCO and an output that generates the feedback signal with reference to the output signal at the frequency of the reference signal for the second input of the phase detector.

DETAILED DESCRIPTION

For the purposes of promoting an understanding of the principles of the embodiments described herein, reference is made to the drawings and descriptions in the following written specification. No limitation to the scope of the subject matter is intended by the references. The description also includes any alterations and modifications to the illustrated embodiments and includes further applications of the principles of the described embodiments as would normally occur to one skilled in the art to which this document pertains.

Figure 1:
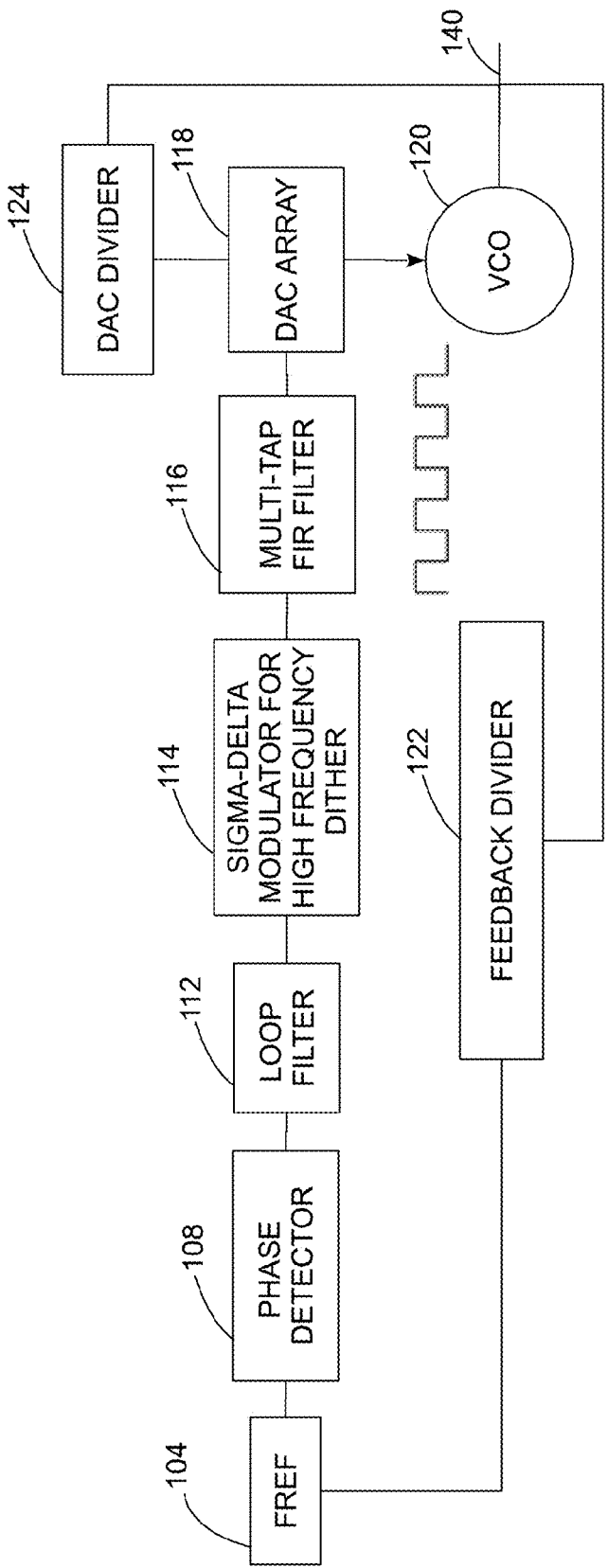
FIG. 1 is a diagram of a digital phase lock loop (PLL) circuit that includes a finite impulse response (FIR) filter to reduce aliasing of quantization noise at low frequencies in a feedback signal from a feedback divider in the PLL circuit.

FIG. 1 depicts a digital PLL circuit 100. The digital PLL 100 includes a phase detector 108, loop filter 112, a sigma-delta modulator 114, a multi-tap finite impulse response (FIR) filter 116, an array of digital to analog converters (DACs) 118, a voltage controlled oscillator (VCO) 120, a DAC divider 124, and a feedback divider 122. The PLL 100 receives an input reference signal from a reference signal generator 104. The phase detector 108 includes two inputs that receive the reference signal and an output of the divider 122 for negative feedback. If the phases from the reference signal and the feedback signal from the divider 122 are not orthogonal to one another (e.g. separated by 90°), then the phase detector 108 generates a digital control signal to adjust the operation of the VCO 120 to correct the phase error. The loop filter 112 filters the digital control signal from the phase detector 108 to generate a digital filtered control signal.

In the PLL circuit 100, the multi-tap FIR filter 116 receives the dithered digital control signal from an output of the sigma-delta modulator 114. The sigma-delta modulator 114 generates the dithered control signal with reference to the control signal from the output of the loop filter 112 and with reference to a randomized high frequency signal (e.g. ¼<sup>th</sup> the frequency of the VCO output signal 120). While the embodiment of the PLL circuit 100 includes the sigma-delta modulator 114 to generate the dithered digital control signal, alternative embodiments include any suitable modulator embodiment that dithers the digital control signal at high frequencies. As described above, the dither signal enables the DAC array 118 to switch between discrete output levels to provide an average control signal to the VCO 120 that more closely approximates an analog control signal. The digital filtered control signal includes artifacts of the quantization error from the digital reference signal The FIR filter 116 includes two or more taps that each correspond to two or more notches in the frequency band for the digital filtered signal that the DAC array 118 receives. As described in more detail below, the notches are centered on the frequencies that are "folded back" during operation of the feedback divider 122 to reduce DC quantization error in the PLL circuit 100. The VCO 120 receives the analog representation of the output signal and generates a modified output signal with a different phase based on the output from the phase detector 108. The negative feedback loop in the PLL 100 continues as the phase of the output signal converges with the phase of the reference signal to correct the error.

Figure 2:
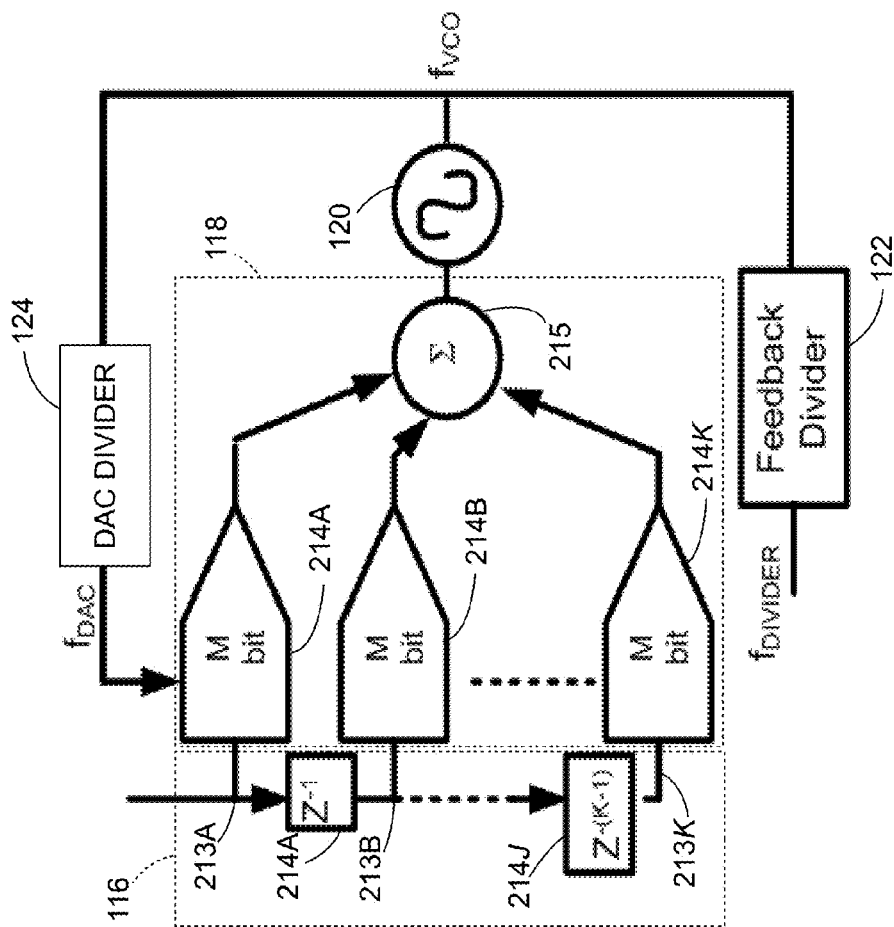
FIG. 2 is a schematic diagram of an arrangement of the FIR filter and an array of digital to analog converters (DACs) for the PLL circuit of FIG. 1.

FIG. 2 depicts the FIR filter and DAC array in one embodiment of the PLL circuit 100 in more detail. In FIG. 2, the FIR filter 116 includes a series of K taps 213A-213K and a series of K−1 filter elements 214A-214J. As is known in the art, the filter elements 214A-214J generate weighted outputs of a history of an input signal to the FIR filter through the K taps 213A-213K. The taps 213A-213K include an output corresponding to each of the filter elements in the FIR filter 116 and to the present-time input, which is the tap 213A in FIG. 1. The output from the each of the taps 213A-213K is connected to an input of a series of K DACs 214A-214K in the DAC array 118. In some embodiments, the DACs 214A-214K are each simpler in design or smaller in size than a single DAC that would otherwise convert the digital filtered control signal to the analog filtered control signal. For example, in one embodiment each of the DACs 214A-214K is a 3-bit DAC. The outputs of the DACs 214A-214K are connected to inputs of a summation circuit 215 that provides the combined analog control signals from the DACs 214A-214K to the VCO 120.

In the embodiment of FIG. 1, the number of taps K in the FIR filter 116 and number of K DACs in the DAC array 118 corresponds to a ratio of the sampling frequency of the DACs in the DAC array 118 to the sampling frequency of the feedback divider 122. In the PLL circuit 100, the DACs in the DAC array 118 receive a clock signal directly from the output of the VCO 120 or a lower-frequency clock from the DAC divider 124, which is an optional frequency divider that receives the output signal from the VCO 120 and generates a frequency-divided clock. The DACs sample digital input signals at the clock frequency, so the sampling frequency of the DAC is the same as the clock frequency from the DAC divider 124 or VCO 120.

The ratio between the sampling frequency of the DACs in the DAC array 118 and the sampling frequency of the feedback divider 122 enables different configurations of the PLL circuit 100 for a tradeoff between sampling frequency in the DACs and the number of DACs and FIR filter elements that are used in the PLL circuit 100. For example, in an embodiment where the DACs in the DAC array 118 sample at the same frequency as the output of the VCO 120, then the number of taps in the FIR filter and DACs in the PLL circuit is equal to the divider ratio for the feedback divider 122. If the divider ratio in the feedback divider 122 is sixteen, then K=16 is used for the number of FIR filter taps and DACs; if the ratio is thirty-two, then K=32, is used and so forth.

The high-frequency operation for the DACs enables better filtering of the quantization noise through the VCO transfer function, Kv/s, but both the number of taps and number of DACs may become unacceptably large for PLL circuits with high multiplication factors from the divider output to the divider input. For example, in a PLL circuit where the divider ratio is one hundred twenty-eight, then the PLL circuit uses K=128 FIR filter taps and DACs if the DACs have the same sampling frequency as the output signal from the VCO 120. The large number of filter taps and DACs are required because sampling the digital signal at the high-frequency of the VCO output signal also samples large portions of the high-frequency quantization noise, which is filtered to prevent the generation of low-frequency quantization error in the feedback divider 122. If the sampling frequency of the feedback divider 122 is ¹⁄₁₂₈<sup>th</sup> the output frequency of the VCO 120 and the DAC divider 124 generates a clock frequency for the DACs to sample at a frequency that is ¼<sup>th</sup> the frequency of the output signal, then $$K = \frac{\frac{1}{4}fclk}{\frac{1}{128}fclk} = \frac{128}{4} = 32,$$

where $f_{clk}$ is the frequency of the output signal from the VCO 120. Another configuration where the DAC divider 124 divides the output signal frequency by a factor of sixteen yields $$K = \frac{\frac{1}{16}fclk}{\frac{1}{128}fclk} = \frac{128}{16} = 8.$$

Lowering the sampling frequencies of the DACs in the DAC array 118 reduces the required number of filter taps and DACs. However, as is known in the art, reducing the sampling frequency of the DACs also increases of the phase noise in the DACs because the filtering provided by the VCO transfer function, Kv/s, an optionally filtering provided by low-pass filters that are connected to the outputs of the DACs is lower for low frequency quantization noise. Consequently, different configurations of the PLL circuit 100 are configured with the appropriate number of K FIR filter taps and DACs based on the ratio of the sampling frequency for the DACs to the sampling frequency in the feedback divider for selected levels of component complexity and performance in the PLL circuit 100.

Figure 3:
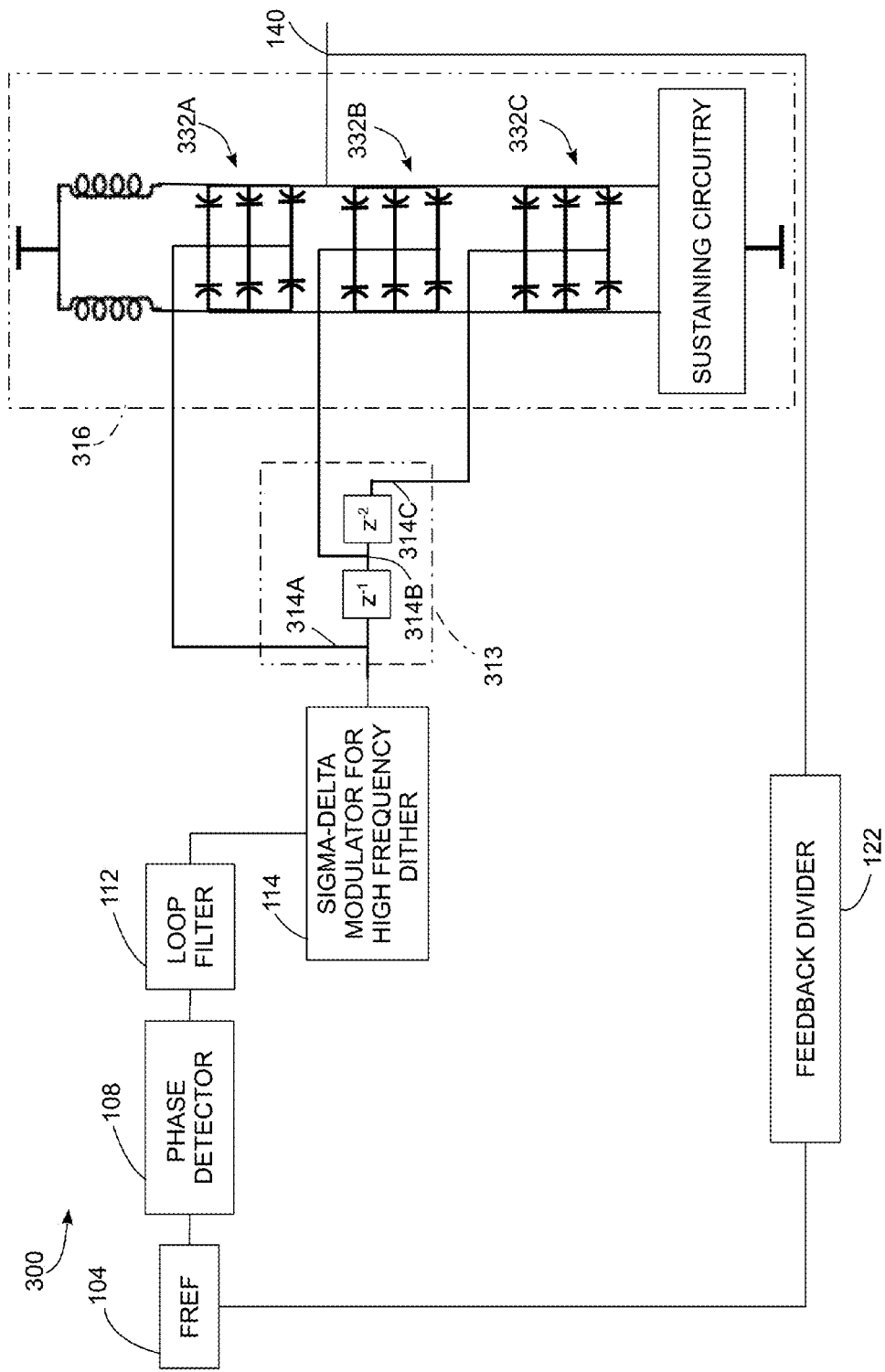
FIG. 3 is a diagram of another embodiment of a digital PLL circuit that includes an FIR filter to reduce quantization noise at low frequencies in a feedback signal from a feedback divider in the PLL circuit.

FIG. 3 depicts another embodiment of a PLL circuit 300 that includes an FIR filter to reduce quantization noise that is aliased in a feedback divider. The PLL circuit 300 includes the phase detector 108, loop filter 112, sigma-delta modulator 114, and feedback divider 122 of the PLL circuit 100 and the PLL circuit operates as a digital PLL in a similar manner to the PLL circuit 100. The sigma-delta modulator 114 includes an input that is connected to an output of the loop filter 112 to generate a dithered control signal with reference to the digital control signal from the loop filter 112. The PLL circuit 300 includes an FIR filter 313 having an input that is connected to the output of the sigma-delta modulator 114 to receive the dithered digital control signal from the sigma-delta modulator 114. In the embodiment of FIG. 3, the FIR filter 313 includes two stages and three taps, although alternative embodiments include two taps or more than three taps. The filter taps 314A, 314B, and 314C generate FIR digital filtered output signals that are directly connected to tunable elements 332A, 332B, and 332C, respectively, in another embodiment of a VCO 316. As used herein, the term "tunable element" refers to any circuit element in a VCO that adjusts the output signal generated by the VCO in response to a digital filtered control signal, such as the control signals from one or more taps in the FIR 313 of FIG. 3.

The VCO 316 includes the tunable elements 332A-332C to enable direct control of the VCO 316 from digital control signals instead of using the DAC array of the PLL circuit 100 to generate analog control signals. In the embodiment of FIG. 3, each tunable element includes an array of six varactor diodes that are arranged in three anti-series pairs. The number of varactor diode pairs N in each tunable element provides $2^N$ distinct output capacitance levels ($2^3$=8 in FIG. 3) for each tunable element, and alternative embodiments can include a larger or smaller number of varactor diode pairs. The varactor diodes enable the tunable elements 332A-332C to act either as capacitors with varying capacitance levels based on the input signal or operate in an open-circuit cutoff mode in response to different digital control signals from the FIR filter 313. The high-frequency dithering in the portions of the digital filtered control signal that pass through the FIR 313 enable the tunable elements 332A-332C to generate intermediate capacitance values in a similar manner to how the dithered digital signal enables a DAC to generate voltage output values that have an average value between the discrete output levels for the DAC. As depicted in FIG. 3, the tunable elements 332A-332C are connected in parallel and the sum of the capacitances from the tunable elements 332A-332C generates a total capacitance for the inductor-capacitor (LC) circuit in the VCO 316, which enables the VCO to output different signal frequencies and to correct phase errors during operation of the PLL circuit 300.

In the circuit 300, the FIR filter 313 operates in a similar manner to the FIR filter 116 of the PLL circuit 100. In particular, the FIR filter 313 is configured with a transfer function that places notches at the sampling frequency $f_{DIV}$ of the feedback divider 122 and at one or more multiples of the feedback divider, such as at $2f_{DIV}$ and $3f_{DIV}$ in the three tap configuration of FIG. 3. The number K of filter taps and the corresponding number of tunable elements in the VCO 316 is based on the ratio between the frequency of the dither signal from the sigma-delta modulator 114 to the sampling frequency of the feedback divider 122. In the embodiment of FIG. 3, the dither signal has a frequency of $\frac{1}{4}^{th}$ the output signal ($f_{elk}$) from the VCO 316 and the frequency divider 316 divides the output signal by a factor of twelve to match the frequency of the reference signal from the reference signal generator 104. Consequently, the number of filter taps and tunable elements is:

$$K = \frac{\frac{1}{4} fclk}{\frac{1}{12} fclk} = \frac{12}{4} = 3,$$

for the three filter taps 314A-314C and three tunable elements 332A-332C that are depicted in the illustrative embodiment of the PLL circuit 300.

Figure 4:
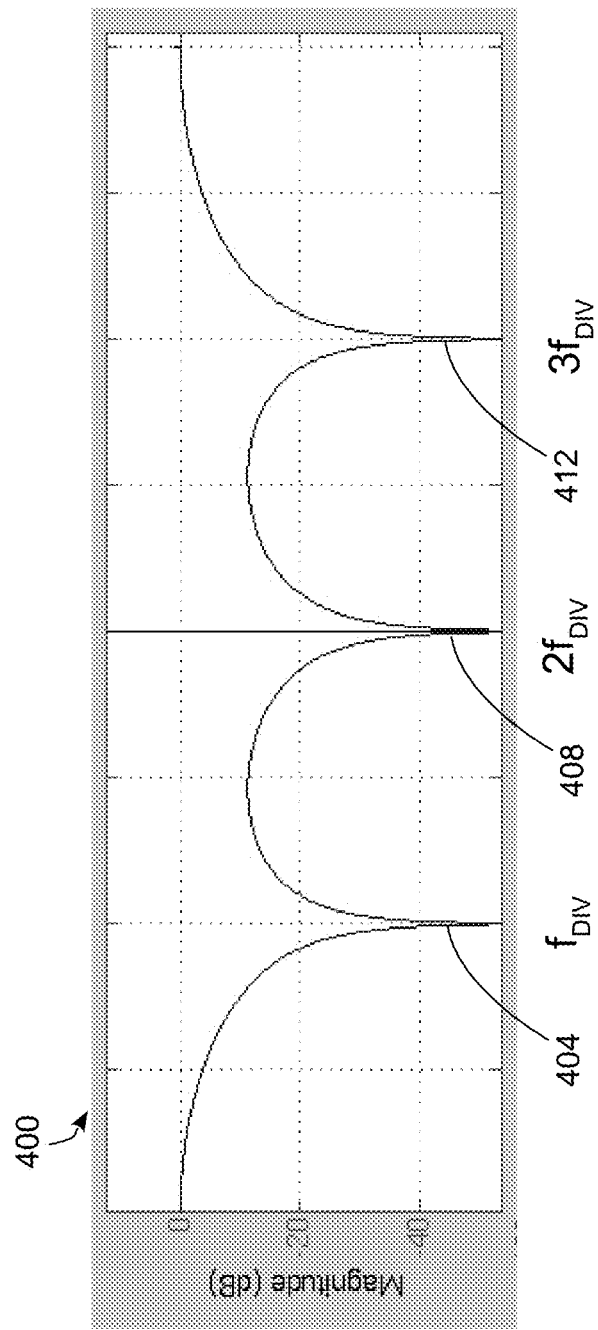
FIG. 4 is a graph of a transfer function for one embodiment of a FIR filter used in the digital PLL circuits of FIG. 1 and FIG. 3.

FIG. 4 depicts a transfer function graph 400 for an embodiment of the FIR filters in the circuits 100 and 300 above that is configured with three (K=4) taps. The transfer function graph 400 includes three notches 404, 408, 412 at frequencies where the FIR filter attenuates the digital control signal from the loop filter 112. As depicted in FIG. 4, the notch 404 is centered on the frequency $f_{DIV}$, which is the sampling frequency of the feedback divider 122 in the PLL circuit 100. The notches 408 and 412 correspond to higher frequency multiples of $2f_{DIV}$ and $3f_{DIV}$, respectively. The FIR filter 116 attenuates quantization noise at the notch frequencies 404-412. Thus, when the lower-frequency feedback divider 122 shifts or "folds back" the higher-frequency elements due to aliasing at the lower-frequency sampling rate of the feedback divider 122, the frequencies 404, 408, and 412 that experience the greatest degree of fold back have little to no noise because the FIR filter 116 has notches that attenuate that noise.

Figure 5:
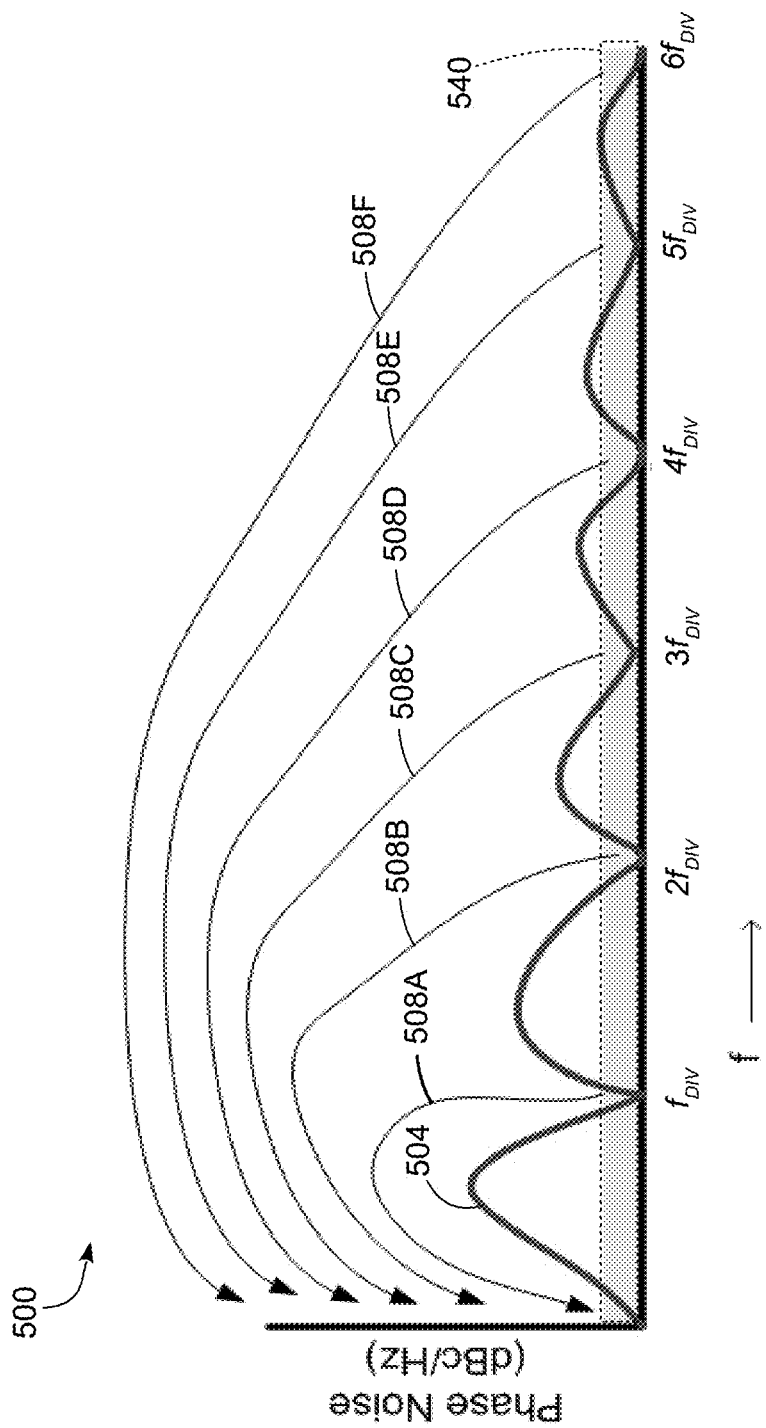
FIG. 5 is a graph depicting filtering of quantization noise at low frequencies in the feedback signals of the digital PLL circuits of FIG. 1 and FIG. 3 by putting notches in the spectrum from where the quantization noise aliases down to lower frequencies.
Figure 6:
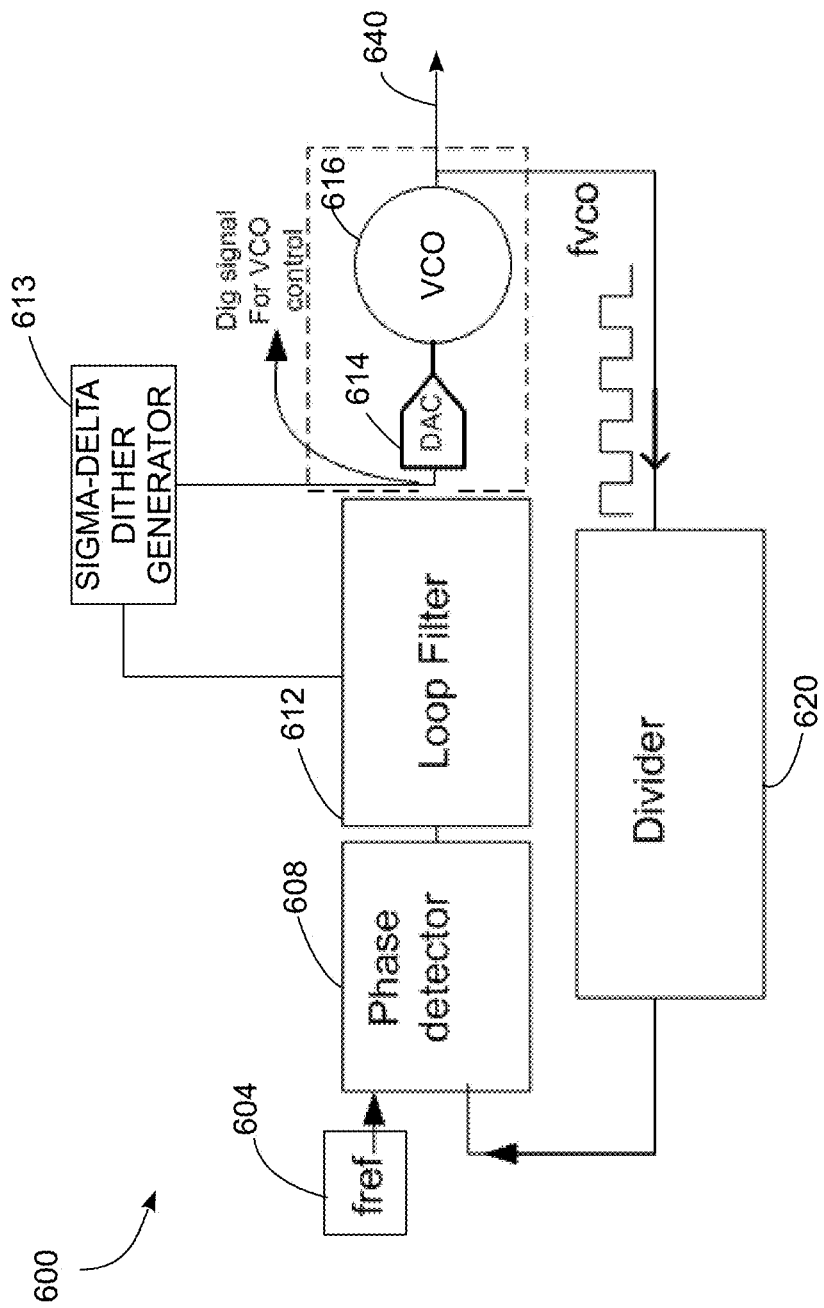
FIG. 6 is a prior art diagram of a digital PLL circuit that produces quantization noise in a feedback signal at DC (0 Hz) due to aliasing in a divider that generates the feedback signal.
Figure 7:
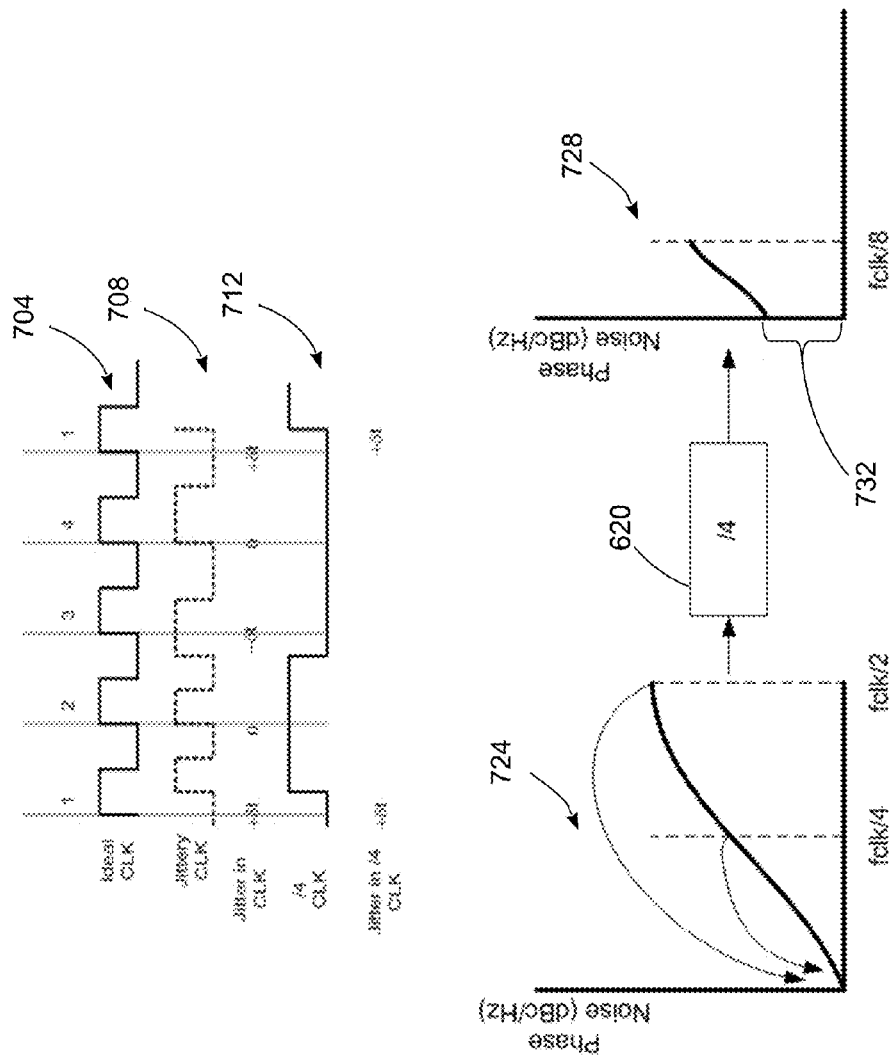
FIG. 7 is a prior art diagram that depicts aliasing of quantization noise to DC (0 Hz) in the prior art digital PLL circuit of FIG. 6.

FIG. 5 depicts a graph 500 of phase noise, which includes the quantization noise, over a frequency range in for a configuration of the PLL circuit 100 or 200 that includes an FIR filter with seven taps to operate with a transfer function that includes six notches. In the graph 500, the plot 504 depicts quantization noise and other phase noise that is present in the digital filtered control signal in the output from the FIR filter. The lower amplitude broadband quantization noise spectrum 540 depicts noise that comes from the jitter of the output signal from the VCO 120. Since the output signal from the VCO 120 serves as the clock signal that controls the operations of the DAC array, the jitter in the output clock also affects the quantization noise of the DACs in the DAC array 118. A more complete explanation of this quantization noise phenomenon in prior art PLLs that do not include the novel embodiments described herein is provided in "Clock Jitter and Quantizer Metastability in Continuous-Time Delta-Sigma Modulators," by James A. Cherry, et al. that appears in IEEE Transactions on Circuits and Systems-II: Analog and Digital Signal Processing, vol. 46, no. 6, June 1999. The FIR filter also reduces the amplitude of the broadband noise 540. In the graph 500, the frequencies $f_{DIV}$ to 6 $f_{DIV}$ correspond to the first six integer multiples of the sampling frequency $f_{DIV}$ in the feedback divider 122. As depicted in FIG. 5, the quantization noise as each of the frequencies $f_{DIV}$ to 6 $f_{DIV}$ in the plot 504 is near zero because the FIR filter includes notches centered at those frequencies. The arrows 508A-508F depict the "fold back" from the harmonic frequencies of the feedback divider sampling rate $f_{DIV}$ to 6 $f_{DIV}$ back to 0 Hz DC. Since the FIR filter attenuates the total quantization noise, the resulting DC quantization noise is substantially reduced from prior art digital PLL circuits.

As depicted in FIG. 5, the FIR filters in the digital PLL circuits of 100 and 300 reduce or eliminate quantization noise at DC (0 Hz) caused by the "folding back" of high-frequency dither quantization noise to DC from aliasing in the feedback divider. Reducing the DC noise enables more efficient operation of the digital PLL circuit, which enables more power-efficient operation because the digital PLL circuit does not need to consume extra power to generate corrected output signals to overcome the effects of the DC quantization noise. The reductions in power consumption are beneficial to many electronic systems, and particularly to battery operated systems or other limited power source systems. The digital PLL circuits of FIG. 1, FIG. 3, and other similar embodiments are used in a wide variety of systems including, but not limited to, communication systems, sensor systems, clock and data recovery systems, microprocessors, and the like.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A phase lock loop circuit comprising:
a phase detector having a first input that receives a reference signal with a predetermined waveform at a predetermined frequency and a second input that receives a feedback signal, the phase detector being configured to generate a digital control signal with reference to the reference signal and the feedback signal;
a loop filter having an input that receives the control signal from an output of the phase detector, the loop filter being configured to generate a digital filtered control signal;
a modulator having an input that receives the digital filtered control signal from an output of the loop filter, the modulator being configured to generate a dithered digital control signal with reference to the digital filtered control signal;
a finite impulse response (FIR) filter having a predetermined number of taps, an input that connects an output of the modulator to the predetermined number of taps, the FIR being configured to reduce quantization noise in the dithered digital control signal;
a plurality of DACs, each DAC having an input that is connected to an output of one of the taps in the FIR filter to generate an analog control signal in response to output from the FIR filter;
a voltage controlled oscillator (VCO) having an input connected to outputs of the plurality of DACs to receive the analog control signal from the plurality of DACs, the VCO being configured to generate an output signal having a frequency that corresponds to a multiple of the frequency of the reference signal with reference to the analog control signal;
a first divider having an input that receives the output signal from the VCO and an output that generates the feedback signal with reference to the output signal at the frequency of the reference signal for the second input of the phase detector; and
a second divider having an input connected to the output of the VCO and an output connected to each DAC in the plurality of DACs, the second divider being configured to generate a clock signal having a lower frequency than the frequency of the output signal and at least twice the frequency of the reference signal to control a sampling frequency in the plurality of DACs.

2. The phase lock loop circuit of claim 1, the predetermined number of taps in the FIR corresponding to a ratio of a first sampling frequency of the plurality of DACs to a second sampling frequency of the first divider, the first sampling frequency being greater than the second sampling frequency.

3. The phase lock loop circuit of claim 2, the predetermined number of taps in the FIR being thirty-two for the ratio of the first sampling frequency of the plurality of DACs to the second sampling frequency of the first divider of thirty-two to one.

4. The phase lock loop circuit of claim 2, the predetermined number of taps in the FIR being eight for the ratio of the first sampling frequency of the plurality of DACs to the second sampling frequency of the first divider of eight to one.

5. The phase lock loop circuit of claim 1 wherein the predetermined number of taps in the FIR filter produce a plurality of notches in a transfer function of the FIR filter, the plurality of notches being centered on at least a sampling frequency of the first divider and twice the sampling frequency of the first divider.

6. A phase lock loop circuit comprising:
a phase detector having a first input that receives a reference signal with a predetermined waveform at a predetermined frequency and a second input that receives a feedback signal, the phase detector being configured to generate a digital control signal in response to the reference signal and the feedback signal;
a loop filter having an input that receives the control signal from an output of the phase detector, the loop filter being configured to generate a digital filtered control signal;
a finite impulse response (FIR) filter having a predetermined number of taps and an input that is connected to an output of the loop filter, the FIR being configured to reduce quantization noise in the digital filtered control signal, wherein the predetermined number of taps in the FIR filter produce a plurality of notches in a transfer function of the FIR filter, the plurality of notches being centered on at least a sampling frequency of the divider and twice the sampling frequency of the divider;
a voltage controlled oscillator (VCO) having a plurality of tunable elements, each tunable element being connected to one tap in the plurality of taps in the FIR filter to enable the VCO to generate an output signal having a frequency that corresponds to a multiple of the frequency of the reference signal with reference to the digital filtered control signal; and
a divider having an input that receives the output signal from the VCO and an output that generates the feedback signal with reference to the output signal at the frequency of the reference signal for the second input of the phase detector.

7. The phase lock loop circuit of claim 6 further comprising:
a sigma-delta modulator having an output connected to the input of the FIR filter, the sigma-delta modulator being configured to generate a dither signal at a first frequency to dither the digital control signal; and
the predetermined number of taps in the FIR corresponding to a ratio of the first frequency of the dither signal to a second sampling frequency of the divider, the first frequency of the dither signal being greater than the second sampling frequency.

8. The phase lock loop circuit of claim 7, the predetermined number of taps in the FIR being three for the ratio of the first frequency of the dither signal to the second sampling frequency of the divider of three to one.

* * * * *